(12) United States Patent
Werner et al.

(10) Patent No.: US 8,040,497 B2
(45) Date of Patent: Oct. 18, 2011

(54) METHOD AND TEST STRUCTURE FOR ESTIMATING FOCUS SETTINGS IN A LITHOGRAPHY PROCESS BASED ON CD MEASUREMENTS

(75) Inventors: Thomas Werner, Reichenberg (DE); Frank Feustel, Dresden (DE); Kai Frohberg, Niederau (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1094 days.

(21) Appl. No.: 11/755,245

(22) Filed: May 30, 2007

(65) Prior Publication Data

US 2008/0131796 A1    Jun. 5, 2008

(30) Foreign Application Priority Data

Nov. 30, 2006   (DE) .......................... 10 2006 056 625

(51) Int. Cl.
*G01B 9/00* (2006.01)
*G01B 11/14* (2006.01)
*G01B 11/04* (2006.01)
*G03F 9/00* (2006.01)
*G03C 5/00* (2006.01)
*G03B 27/32* (2006.01)
*G01N 21/86* (2006.01)
*G01V 8/00* (2006.01)

(52) U.S. Cl. .......... 356/124; 356/625; 356/636; 430/22; 430/30; 355/77; 250/559.19; 250/559.24

(58) Field of Classification Search ........................ None
See application file for complete search history.

(56) References Cited

U.S. PATENT DOCUMENTS

| | | | |
|---|---|---|---|
| 5,087,537 A * | 2/1992 | Conway et al. | 430/15 |
| 5,847,818 A * | 12/1998 | Lin et al. | 356/124.5 |
| 6,063,531 A * | 5/2000 | Singh et al. | 430/30 |
| 6,208,748 B1 * | 3/2001 | Troccolo et al. | 382/100 |
| 6,602,727 B1 * | 8/2003 | Rangarajan et al. | 438/14 |
| 6,603,529 B1 * | 8/2003 | Finarov | 355/27 |
| 6,606,152 B2 * | 8/2003 | Littau et al. | 356/124 |
| 6,701,512 B2 * | 3/2004 | Sutani et al. | 716/53 |
| 7,352,451 B2 * | 4/2008 | Levinski et al. | 356/123 |
| 7,352,453 B2 * | 4/2008 | Mieher et al. | 356/125 |
| 7,479,633 B2 * | 1/2009 | Archie | 250/310 |
| 7,642,019 B2 * | 1/2010 | Kim | 430/30 |
| 7,855,037 B2 * | 12/2010 | Kim | 430/5 |
| 2002/0048857 A1 | 4/2002 | Saito et al. | 438/140 |

(Continued)

FOREIGN PATENT DOCUMENTS

JP             07326563 A  * 12/1995

(Continued)

OTHER PUBLICATIONS

Translation of Official Communication from German Patent Office dated Jul. 19, 2007.

*Primary Examiner* — Tarifur Chowdhury
*Assistant Examiner* — Gordon Stock, Jr.
(74) *Attorney, Agent, or Firm* — Williams, Morgan & Amerson, P.C.

(57) ABSTRACT

By encoding process-related non-uniformities, such as different height levels, which may be caused by CMP or other processes during the fabrication of complex device levels, such as metallization structures, respective focus parameter settings may be efficiently evaluated on the basis of well-established CD measurement techniques.

16 Claims, 5 Drawing Sheets

U.S. PATENT DOCUMENTS

| | | | |
|---|---|---|---|
| 2002/0058407 A1 | 5/2002 | Chang et al. | 438/637 |
| 2002/0131055 A1* | 9/2002 | Niu et al. | 356/603 |
| 2002/0155356 A1* | 10/2002 | Fujimoto | 430/5 |
| 2003/0165749 A1* | 9/2003 | Fritze et al. | 430/5 |
| 2004/0165194 A1* | 8/2004 | Hansen | 356/521 |
| 2004/0190008 A1* | 9/2004 | Mieher et al. | 356/625 |
| 2005/0185174 A1* | 8/2005 | Laan et al. | 356/243.1 |
| 2005/0277035 A1* | 12/2005 | Yamamoto | 430/30 |
| 2006/0160037 A1 | 7/2006 | Brodsky et al. | 430/396 |
| 2007/0041003 A1* | 2/2007 | Ausschnitt et al. | 355/55 |
| 2007/0105029 A1* | 5/2007 | Ausschnitt | 430/30 |
| 2007/0146670 A1* | 6/2007 | Kruijswijk | 355/55 |
| 2008/0018874 A1* | 1/2008 | Dusa et al. | 355/55 |
| 2010/0103433 A1* | 4/2010 | Ausschnitt | 356/630 |

FOREIGN PATENT DOCUMENTS

JP    2003347201 A  * 12/2003

* cited by examiner

METHOD AND TEST STRUCTURE FOR ESTIMATING FOCUS SETTINGS IN A LITHOGRAPHY PROCESS BASED ON CD MEASUREMENTS

BACKGROUND OF THE INVENTION

1. Field of the Invention

Generally, the present disclosure relates to the field of manufacturing integrated circuits, and, more particularly, to the formation of device features on the basis of lithography techniques requiring sensitive focus parameters.

2. Description of the Related Art

Typically, the fabrication of modern integrated circuits includes a complex process flow, in which a large number of individual processes are performed, such as deposition, implantation, etching, lithography and the like. For example, a typical process sequence frequently encountered may involve the deposition of conductive, semiconductive or insulating material layers on an appropriate substrate. After deposition of the corresponding layer, device features may be formed in the material layer by patterning the corresponding layer on the basis of photolithography and etch techniques, thereby creating a certain topography by the resulting features, such as trenches, vias, lines and the like, which are formed from the underlying material layer. The resulting surface topography may also affect further manufacturing processes, such as the deposition and patterning of subsequent layers. Since sophisticated integrated circuits are typically comprised of a plurality of stacked material layers, each of which may bear a specified spatial relationship to underlying and overlying layers, it has become standard practice to periodically planarize the surface of the substrate to provide well-defined conditions for deposition and patterning of subsequent material layers. This holds especially true for so-called metallization layers in which metal interconnect structures are formed to electrically connect the individual device features, such as transistors, capacitors, resistors and the like, to establish the functionality required by the circuit design.

Recently, the so-called damascene or inlaid technique has become a preferred method in forming metallization layers, wherein a dielectric layer is deposited and patterned to include trenches and vias that are subsequently filled with an appropriate metal, such as copper, copper alloys and the like. In this manufacturing regime, the previously formed trenches and/or vias have to be filled such that the various openings, which may have different sizes, may be reliably filled, thereby requiring the deposition of a certain amount of excess material. The excess metal is then removed and the resulting surface is planarized by performing a planarization process which may typically comprise a chemical mechanical polishing (CMP) process. Chemical mechanical polishing (CMP) has proven to be a reliable technique to remove the excess metal and planarize the resulting surface to leave behind metal trenches and vias that are electrically insulated from each other as required by the corresponding circuit layout. Chemical mechanical polishing typically requires the substrate to be attached to a carrier, a so-called polishing head, such that the substrate surface to be planarized is exposed and may be placed against a polishing pad. The polishing head and polishing pad are moved relative to each other by individually moving the polishing head and the polishing pad. Typically, the head and pad are moved against each other while controlling the relative motion to achieve as uniform a material removal as possible.

However, the removal rate may not only depend on the characteristics of the chemical and mechanical adjustments of the polishing process but also on the type of materials to be polished and the local pattern geometry. For instance, at a polishing state where the major portion of the metal has already been removed, the dielectric material and metal, such as copper, barrier material and the like, may be treated concurrently with different removal rates, thereby resulting in a certain degree of non-uniformity, wherein a varying degree of metal coverage of the currently polished surface, due to a difference in pattern density with respect to the metal regions, may also contribute to corresponding overall non-uniform planarity. For example, the presence of a plurality of closely spaced metal lines may result in a higher total removal rate for the dielectric material and the metal compared to areas including isolated lines. The resulting different non-uniformity of the surface topography may, however, affect subsequent processes, such as the deposition of dielectric materials and the patterning thereof on the basis of sophisticated lithography techniques, due to the very restricted process window when highly scaled devices are considered, as will be explained in more detail with reference to FIGS. 1a-1c.

Figure 1A:
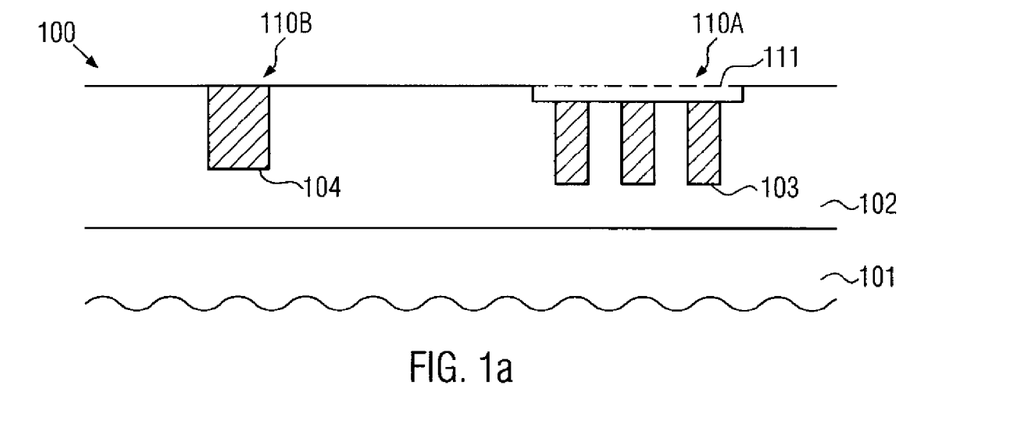
FIGS. 1a-1c schematically illustrate cross-sectional views of a conventional semiconductor device during various manufacturing stages for forming a metallization structure of an advanced semiconductor device resulting in patterning errors caused by CMP-induced surface non-uniformities.
Figure 1B:
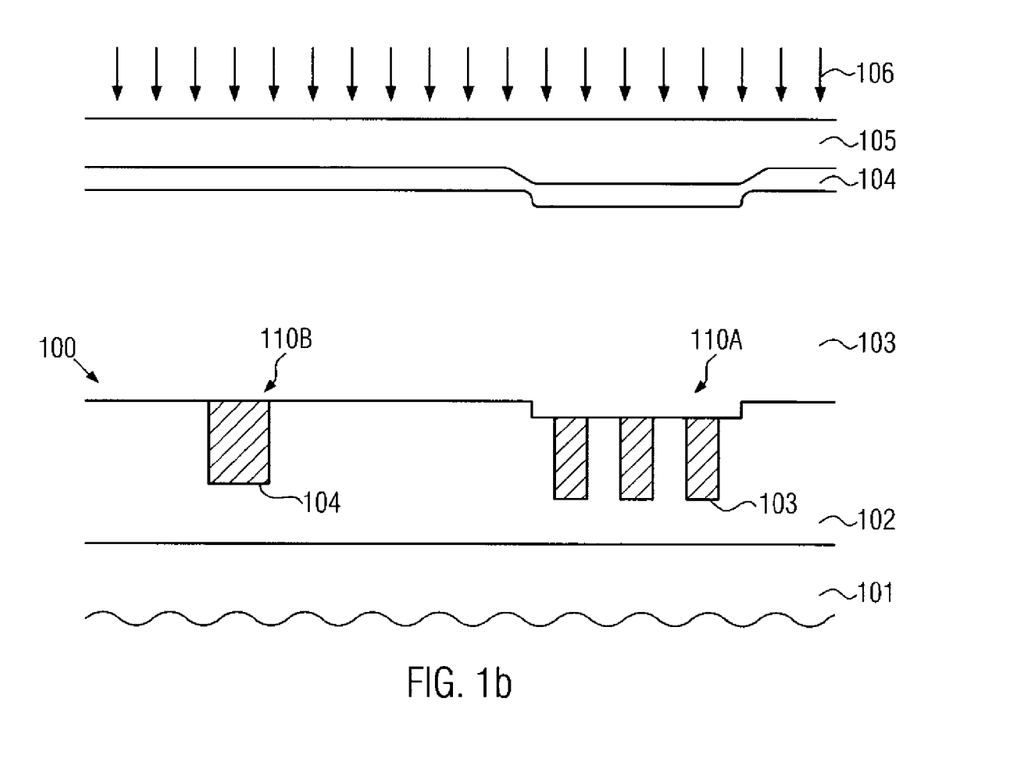
Figure 1C:
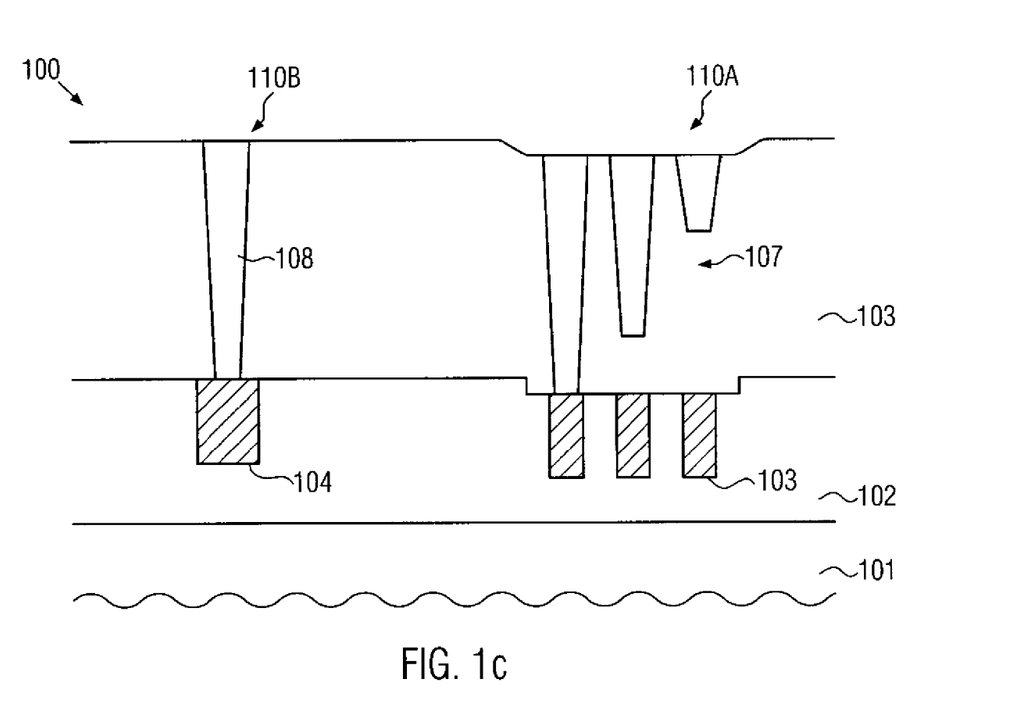

FIGS. 1a-1c schematically illustrate cross-sectional views of a semiconductor device 100 at various stages during the fabricating of a metallization layer according to a typical damascene process sequence.

In FIG. 1a, the semiconductor device 100 comprises a substrate 101 including circuit features and any other components related thereto, which, for convenience, are not shown in FIG. 1a. Furthermore, a dielectric layer 102 may be provided above the substrate 101, and above any circuit elements formed therein and thereon, which may represent the dielectric material of a respective metallization layer of the device 100. The dielectric layer 102 may be comprised of any appropriate material, such as silicon dioxide, silicon nitride and the like, wherein, in sophisticated applications, the dielectric layer 102 may at least be partially comprised of a low-k dielectric material having a relative permittivity of approximately 3.0 and significantly less. Furthermore, in and above the dielectric layer 102 are defined device areas 110A, 110B in which different structural characteristics, such as pattern density and the like, may result in respective non-uniformities of the resulting surface topography. For instance, in the area 110A, a plurality of closely spaced metal-filled trenches 103 may be provided, while the area 110B may be characterized by a significantly reduced metal density, for instance by including an isolated metal trench 104. It should be appreciated that the areas 110A, 110B are illustrative examples of different structural characteristics with respect to the effective "averaged" metal contents in respective device areas. Furthermore, it should be appreciated that the device areas 110A, 110B may not necessarily be defined by well-defined boundaries but may be substantially determined by the corresponding "global" or "averaged" effect during certain manufacturing processes, such as a CMP process, which will be described later on in more detail. The metal-filled trenches 103, 104 may comprise highly conductive metal materials, such as copper, copper alloys and the like, which may typically be provided in combination with respective barrier materials (not shown) in order to reduce out-diffusion of copper material, enhance the adhesion thereof to the neighboring dielectric material and reduce any interaction of reactive components with the highly sensitive copper material.

Typically, the semiconductor device 100 as shown in FIG. 1a may be formed on the following process techniques. After the completion of any circuit elements including respective contact portions and the like, the dielectric layer 102 may be formed on the basis of well-established recipes, which may include the deposition of an etch stop material (not shown)

followed by the application of an appropriate dielectric material, such as a low-k dielectric material or a combination of a silicon dioxide-based dielectric material in combination with other low-k dielectric materials, depending on the device requirement. Next, sophisticated lithography processes may be performed in order to form appropriate openings in the dielectric layer 102, wherein sophisticated lithography techniques may be used, as will be described later on with reference to FIG. 1b. Thereafter, the resulting openings, such as trenches and the like, may be filled with an appropriate conductive material, wherein typically respective barrier materials may be deposited, for instance on the basis of chemical vapor deposition (CVD), physical vapor deposition (PVD) and the like. Subsequently, after providing appropriate seed materials, such as copper and the like, the copper-based material may be deposited on the basis of a wet chemical deposition process requiring highly sophisticated process regimes to fill the respective trenches from bottom to top in a substantially void-free manner. Furthermore, in order to reliably fill the respective trenches, which may have different lateral sizes, depth and the like, a certain amount of excess material may also be formed on horizontal surface portions of the device 100, wherein the resulting surface topography may depend significantly on the local deposition conditions, which, in turn, may be determined, among others, by the different pattern densities in the respective areas 110A, 110B. After the deposition process, the corresponding excess material may be removed, wherein usually a CMP process may be applied, at least at a final phase. During the removal of the copper material, the seed layer and the barrier materials, highly complex CMP process conditions may occur during the final phase of the CMP process, thereby resulting in respective surface non-uniformities, that is, in the various device areas 110A, 110B, different height levels may be created locally, as is, for instance, indicated by the dashed line 111, which may represent enhanced material removal of the dielectric material and the metal in the trenches 103 compared to the situation in the area 110B. It should further be appreciated that the respective surface topography of the area 110A may further comprise a certain "fine structure" since the material erosion in the respective trenches 103 compared to the neighboring dielectric areas may also be different, which is however not shown in FIG. 1a. Consequently, although a generally substantially flat surface topography may be provided, nevertheless a certain degree of non-planarity with respect to the specified device areas 110A, 110B may have been created, for instance by CMP, thereby providing a difference in height levels and thus a certain amount of non-planarity which may vary depending on device-specific characteristics, such as pattern density and the like.

FIG. 1b schematically illustrates the semiconductor device 100 in a further advanced manufacturing stage. Here, a further dielectric layer 103 may be provided, followed by an anti-reflective coating (ARC) 104 and a resist layer 105 in order to prepare the device 100 for a further sophisticated lithography process in order to pattern the dielectric layer 103 for receiving via openings and/or trenches, depending on the process requirements. As previously explained, one essential process in the manufacturing of semiconductor devices is the lithography process, since exposure processes at the various device levels represent the major part of the overall production costs while also providing the potential for compensating for across-substrate non-uniformities and also rectifying exposure-specific errors prior to permanently transferring such exposure-specific errors into the semiconductor structure, such as the dielectric layer 103. It is thus of great importance to provide process conditions for reliably imaging the respective device features having the minimum lateral dimensions of the circuit design of the respective process layer under consideration into the resist material 105. The resolution of the corresponding imaging process is substantially determined by the numerical aperture of the imaging system, the exposure wavelength and the depth of focus. For obtaining an increased resolution, typically the exposure wavelength may be reduced, which results, for a fixed numerical aperture, in a reduced depth of focus. For instance, with ever decreasing exposure wavelengths, which may presently be at approximately 190 nm for critical lithography processes also used in the metallization level, the requirements with respect to appropriately focusing each exposure field are becoming more and more stringent. In an exposure process, therefore, highly complex and automated procedures are performed in order to appropriately align and focus the substrate to be exposed. The alignment and focusing procedure is usually performed individually for each exposure field in a step and scan system and may thus require different alignment and focusing values of the respective parameters. For example, in the presence of non-uniformities of the resulting surface topography, for instance the respective non-uniformity 111 in the areas 110A, 110B, which may represent respective areas within a specific die region and which may therefore be contained in the same exposure field, the respective exposure process may result in slightly defocused latent images in some of these areas, depending on the respective non-uniformities. Thus, during a lithography process 106, the difference in planarity in the regions 110A, 110B, as indicated by 111, may cause respective non-uniformities of the imaging process and subsequently respective non-uniformities during the patterning of the dielectric layer 103. Hence, respective patterning errors and even missing patterns may occur due to the CMP-induced non-uniformities 111.

FIG. 1c schematically illustrates a cross-sectional view of the device 100 in an advanced manufacturing stage, wherein respective via openings 107 may be formed above the area 110A, and a corresponding opening 108 may be formed above the area 110B. As illustrated, the difference in the surface planarity may result in respective patterning errors or even missing features, wherein it may be assumed that the respective focus conditions may not have been appropriate for the area 110A. In this case, the respective resist features formed from the resist layer 105 on the basis of the exposure process 106 may result in corresponding pattern transfer errors during the subsequent anisotropic etch process, finally resulting in faulty interconnect structures.

Thus, although the critical dimensions of the respective device level, such as the level formed on the basis of the exposure process 106, may be monitored and controlled on the basis of appropriately designed CD (critical dimension) measurement structures during respective metrology strategies, the corresponding patterning errors, such as the faulty openings 107, may not be efficiently detected by conventional CD monitoring techniques but may require sophisticated electrical tests, thereby additionally increasing cycle time, increasing defect rate caused by the additional electrical tests and the like. Furthermore, respective electrical measurement data of focus related patterning errors may be available after permanently transferring the respective patterns into the respective device level, thereby producing respective faulty devices in exposure fields processed on the basis of inappropriate focusing parameters.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to a technique for monitoring the quality of a lithography process by determining respective lateral dimensions of respective test features, such as resist features, lines, openings and the like, patterned on the basis of the lithography process. The test features may be formed on the basis of different structural characteristics, such as a different degree of planarity in respective device areas in order to also evaluate the focusing conditions during the actual exposure process, thereby providing an efficient means for determining the validity of respective focusing parameters with respect to non-uniformities that may be present in the corresponding exposure field or across the entire substrate under consideration. For this purpose, a systematic variation of at least one structural characteristic, which may have a significant influence on the overall surface planarity and thus the focusing adjustment procedure, may be "superimposed" on appropriately designed test features, which may be used for a subsequent CD measurement. Consequently, well-established measurement procedures and tools used for CD measurements may be advantageously employed to obtain respective focus-related measurement data without undue delay in order to estimate the focus conditions and, in some aspects, control the respective focusing conditions.

According to one illustrative embodiment disclosed herein, a method for estimating a parameter setting of a lithography process for forming microstructure features is provided. The method comprises obtaining a first measurement data from a first test site representing a specific feature type formed during the lithography process based on a specified focus setting, wherein the first test site is formed above a first area. Furthermore, the method comprises obtaining a second measurement data from a second test site representing the specific feature type, wherein the second test site is also formed by the lithography process based on the specified focus setting and is located above a second area. The first and second areas differ in at least one characteristic affecting focus conditions during the lithography process. Finally, the method comprises estimating the specified focus setting on the basis of the first and second measurement data.

According to another illustrative embodiment disclosed herein, a method comprises evaluating at least one lateral dimension of a first test feature of a semiconductor device, wherein the first test feature is formed on the basis of a specified design above a first area by using a lithography process, wherein the first area comprises a first density of metal. The method further comprises evaluating at least one lateral dimension of a second test feature of a semiconductor device, wherein the second test feature is formed on the basis of the specified design above a second area by using the lithography process, wherein the second area comprises a second density of metal that differs from the first density. Moreover, the method comprises determining the validity of at least one parameter used for adjusting a focus during the lithography process on the basis of the at least one evaluated lateral dimension of the first and second test features.

According to yet another illustrative embodiment disclosed herein, a test structure comprises a material layer formed above a substrate and having a plurality of laterally arranged areas, wherein each area represents a different value of a structural characteristic that affects a surface topography of the material layer. Furthermore, the test structure comprises a plurality of test sites, wherein each test site is formed above a respective one of the areas and includes at least one feature for evaluating a lateral dimension of a specified device feature of a semiconductor device.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein addresses the problem of reduced lithography performance caused by process or structure induced non-uniformities, such as a varying degree of planarity across extended portions of a substrate, which may even result in significant planarity differences within a single exposure field, thereby possibly resulting in respective patterning errors, as previously described. To this end, the subject matter disclosed herein provides a technique in which well-established measurement strategies, typically used for CD measurements, may be efficiently modified to also obtain available information on the quality of the corresponding focusing parameters used for performing a respective exposure process. That is, a respective mechanism may be identified which may have a significant influence on the focus status of different device areas within a single exposure field, so that the corresponding mechanism may be used in a well-defined manner for generating respective test sites in a CD measurement structure, thereby "encoding" focus-related effects of the exposure process into the respective measurement sites. Consequently, upon performing respective CD measurements on the measurement structure including the differently "encoded" sites, the influence of the non-uniformities within the entire exposure field may be efficiently estimated and hence the validity of the corresponding exposure conditions used for the lithography process may be evaluated. In this manner, the validity of the corresponding focusing parameters may be examined at a very early manufacturing stage, for instance, corresponding measurement procedures may be performed on the basis of resist features, thereby providing the possibility of reworking processed substrates when respective focus settings previously used are identified as being inappropriate. Moreover, respective focus-related measurement data may be obtained along with "standard" CD measurement data, thereby not unduly contributing to substrate cycle times while providing the potential for reducing or even completely avoiding complex electrical tests in order to verify the validity of respective focus settings, when, for instance, device features of a metallization structure are considered.

As previously explained, in sophisticated semiconductor devices requiring complex metallization structures, advanced lithography processes are also required in the metallization level, wherein, in particular, CMP-induced non-uniformities may significantly affect the corresponding performance of the lithography process. Hence, the subject matter disclosed herein is highly advantageous in the context of the formation of complex metallization structures, since, here, the effects of the CMP-induced non-uniformities may be efficiently "encoded" into respective test sites of a CD measurement structure, for instance by varying the pattern density of underlying metal structures to effectively cover a significant portion or the entire range of non-uniformities to be expected across a total exposure field or even across extended areas of a respective semiconductor device. In this case, appropriate focus parameter settings may be established prior to actually processing product substrates, for instance when respective test substrates may be processed and evaluated prior to releasing the product substrates, thereby significantly reducing focus related-yield losses. In other cases, the respective test structures including the "encoded" focus-related information may be formed on product substrates in order to monitor the quality of the lithography process and/or even control the focus adjustment process on the basis of the respective CD measurement data. At any rate, respective complex electrical tests for verifying the integrity of interconnect structures may be significantly reduced or may be even completely avoided with respect to identifying focus-related patterning errors, thereby reducing overall cycle time and also reducing defect rate, as typically such electrical tests may be associated with increased particle generation and the like.

In other situations, the subject matter disclosed herein may be applied to any manufacturing sequence in which complex lithography processes may be required for patterning respective device features. For instance, the process of patterning gate electrodes is highly critical in modern CMOS devices and requires high surface uniformity due to the highly scaled critical dimensions involved. Also, in this case, respective uniformity influencing mechanisms may be identified, for instance, the density of isolation trenches and the like, which may result in a corresponding varying degree of planarity, which may also be efficiently encoded into the respective test sites of the CD measurement structure for evaluating the validity of the corresponding focus settings.

Figure 2A:
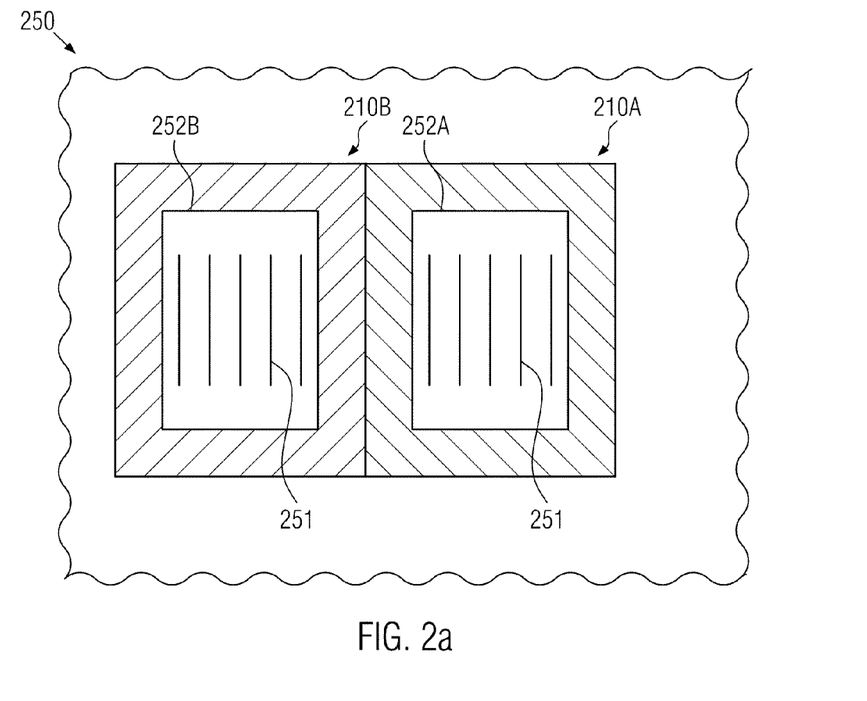
FIGS. 2a-2b schematically illustrate a top view and a cross-sectional view, respectively, of a test structure including test sites for individually determining critical dimensions of device features, wherein each test site is formed on the basis of a well-defined structural characteristic that influences the focusing behavior during a corresponding focus adjustment procedure according to illustrative embodiments disclosed herein.

FIG. 2a schematically illustrates a plane view of a test structure 250 that may be formed above a specific material layer 203 as may also be used for forming specific device features of microstructure devices, such as integrated circuits and the like. The material layer 203 may be comprised of dielectric materials, metals, semiconductors and the like, according to process and device requirements of a corresponding manufacturing process. The material layer 203 may be formed above an appropriate substrate (not shown) as may typically be used for forming respective microstructure devices, wherein, in some illustrative embodiments, the material layer 203 may represent a corresponding material layer of an actual product substrate, which may include device areas in which actual devices are formed. In other illustrative embodiments, the material layer 203 may be formed above a dedicated test substrate, which may be used for obtaining appropriate measurement data on the basis of the test structure 250, as will be described later on in more detail. The material layer 203 may comprise a first area 210A and a second area 210B, wherein, above each of the areas 210A, 210B, a respective test site 252A, 252B is formed, each of the test sites 252A, 252B comprising respective features 251, such as lines and the like, appropriate for determining critical lateral dimensions of respective device features that are to be represented by the test features 251 of the test structure 250. In some illustrative embodiments, the design of the corresponding test sites 252A, 252B may be identical, wherein, however, the areas 210A, 210B may be provided in a form so as to differ in at least one structural characteristic that may have an influence on the focus conditions during a lithography process for forming the test structure 250. For example, the areas 210A, 210B may represent areas of different height levels with respect to at least one underlying portion or sub-layer of the material layer 203, which may intentionally be generated in order to represent a corresponding range of different height levels in corresponding product areas of an actual microstructure device. As previously explained, corresponding different height levels may have a significant influence on the result of the corresponding exposure process, since the adjusted focus plane, even if individually selected for each exposure field during a step and scan exposure process, may encounter the plurality of different height levels and may therefore result in a difference of the finally obtained device features. It should be appreciated that corresponding intentionally created differences of a structural characteristic for the areas 210A, 210B may be obtained on the basis of structural differences as may also be encountered across the entire exposure field, for instance, in the form of a varying pattern density and the like. In this case, a high degree of authenticity with respect to actual device areas may be obtained since similar structural characteristics in combination with the same manufacturing processes may be used so that the corresponding finally obtained structural differences in the areas 210A, 210B may be appropriate representatives of respective product areas.

In other cases, a respective non-planarity level in the test structure 250 may be obtained by selectively treating certain portions or sub-layers of the material layer 203, while substantially excluding product areas from a respective treatment or by providing the structure 250 on dedicated test substrates, in which the process for forming the material layer 203 may include additional process steps compared to an actual manufacturing process. In this case, a correlation between the non-planarity represented by the areas 210A, 210B and a corresponding non-planarity of actual product areas may be established on the basis of separate measurements so that the same type of measurement structure 250 may be used for very different process levels substantially without being affected by the actual manufacturing process flow of the device layer under consideration.

Figure 2B:
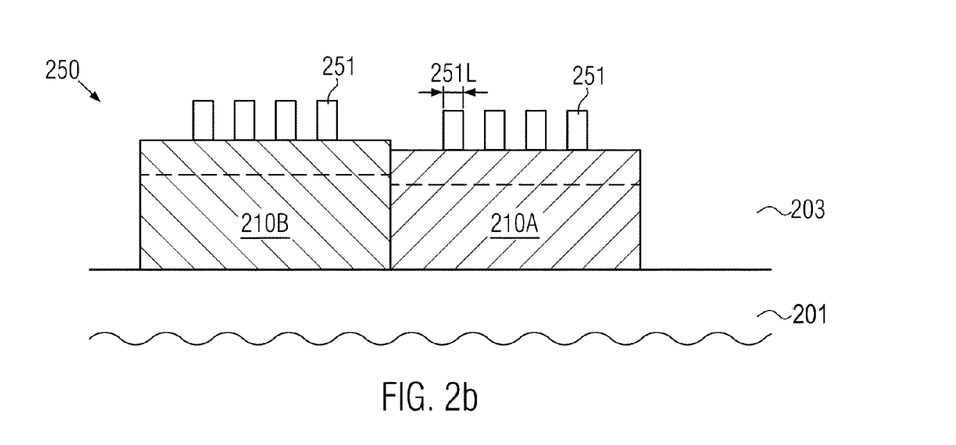

FIG. 2b schematically illustrates a cross-sectional view of the test structure 250. As shown, the test structure 250 may comprise a substrate 201, which may represent any appropriate carrier material for forming thereon and therein respective microstructure devices, such as integrated circuits and the like. As previously discussed, the substrate 201 may represent a product substrate comprising a plurality of microstructure devices corresponding to a manufacturing stage represented by the test structure 250. Furthermore, the material layer 203 is formed above the substrate 201 and may have any appropriate configuration in order to appropriately encode a range of focus-influencing states or values of structural characteristics into the test structure 250. For example, as illustrated in FIG. 2b, within a specific level of the material layer 203, a difference in height may have been created, for instance by a different effect of a corresponding process step, such as a CMP step, as previously explained, thereby providing different conditions for subsequent steps for forming further portions of the material layer 203, for instance for depositing other materials as required in the corresponding manufacturing process flow under consideration. In the test structure 250, the corresponding non-planarity of the areas 210A, 210B may be intentionally selected so as to cover at least a significant portion of respective variations in actual device areas in order to appropriately estimate the influence of the degree of non-planarity covered by the test structure 250 on the corresponding test features 251, i.e., on respective lateral dimensions 251L thereof.

The test structure 250 as shown in FIGS. 2a and 2b may be formed on the basis of the following processes. Depending on whether the test structure 250 is to be provided on a product substrate or a dedicated test substrate, respective manufacturing processes may be performed to provide respective device features in respective device areas in and above the substrate 201. For example, if the test structure 250 is to be provided on product substrates during a manufacturing sequence for forming a metallization structure, respective circuit elements and other device features may have been formed in previous manufacturing processes on the basis of well-established techniques as also previously described. Thereafter, the material layer 203 may be formed on the basis of appropriate process techniques, which may include the deposition and patterning of respective materials, such as dielectric materials, conductive materials and the like, depending on the process requirements. For example, during the step of patterning a respective portion of the material layer 203, predefined structural differences may be incorporated in order to obtain the desired difference between the first and second areas 210A, 210B, for example with respect to a specified difference in the degree of planarity. For example, the dimension and/or the density of respective features, such as lines and the like, may be selected differently in the first and second areas 210A, 210B, which may thus result in a different degree of height level due to a certain degree of pattern dependence of a subsequent manufacturing process, such as a CMP process, as previously explained with reference to the semiconductor device 100.

Thereafter, further manufacturing processes, for instance the deposition of other appropriate material layers such as dielectric layers and the like, may be performed and finally a corresponding layer stack may be created, as may be required for performing a respective lithography process for patterning the test features 251. Typically, during the focusing procedure for subsequently imaging the corresponding exposure field containing the pattern of the test structure 250 into the respective resist layer, additional optical means, such as lasers and the like, and/or inherent optical systems of a respective exposure tool, may be used for selecting the distance between the substrate 201 and the corresponding focus plane of the lithography tool. That is, the substrate 201 may be tilted with respect to specified directions in order to automatically estimate on the basis of optical data gathered for different values of the respective tilt angles, an optimum focused state, wherein the respective optical data may be obtained on the basis of specified alignment positions of the substrate 201, i.e., of the respective exposure field. Hence, a respective set of values for focus parameters may be generated and may be used for exposing the resist layer, wherein the varying degree of planarity may finally result in different exposure conditions across the entire exposure field, wherein corresponding differences in the lithography behavior may therefore be encoded in a systematic manner into the test structure 250, due to predefined different structural characteristics, such as a difference in height level. After the lithography process, the test features 251 may be formed on the basis of the latent image generated in the exposed resist layer wherein, depending on the process strategy, the features 251 may represent resist features or features actually formed in a lower lying material layer. Evaluating the test structure 250 in a postexposure state prior to actually patterning the corresponding latent image into a lower lying material layer may provide the potential of reworking respective product substrates, when an inappropriately selected parameter setting, for instance with respect to the focus setting, may be identified.

Consequently, based on measurements data relating to the lateral dimensions 251L, which may be obtained by well-established in-line measurement techniques using, for instance, scanning electron microscopes, scatterometry devices and the like, the respective performance of the lithography process may be evaluated in view of focus-related issues, since the test structure 250 may provide substantially identical exposure conditions except for the "encoded" focus-related influences caused by the structural difference between the areas 210A, 210B. Based on the corresponding information, for instance, a difference of respective lateral dimensions 251L in the first and second areas 210A, 210B caused by a moderately defocused exposure state, the validity of the corresponding focus setting may be determined.

Figure 2C:
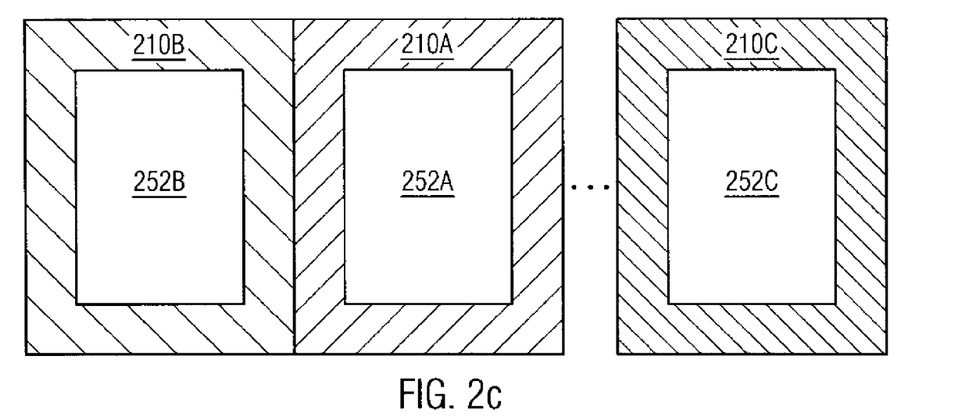
FIG. 2c schematically illustrates a top view of the test structure including a plurality of test sites with varying values of the specified structure characteristic in order to obtain more detailed information with respect to focus influencing effects across an entire exposure field or extended substrate areas according to further illustrative embodiments.

FIG. 2c schematically illustrates a plane view of the test structure 250 according to a further illustrative embodiment, wherein a plurality of respective test sites 252A, 252B, 252C are formed above respective device areas 210A, 210B, 210C, each having a different structural characteristic, as previously explained, in order to obtain a "finer" resolution with respect to influences of various degrees of non-uniformity with respect to the focus setting under consideration. For example, the plurality of test sites 252A, 252B, 252C may substantially cover the entire range of expected non-uniformities in actual device areas or even across entire product substrates in order to appropriately determine an appropriate set of focus parameters for a device layer under consideration. For instance, a plurality of test structures 250 may be provided on a dedicated test substrate, wherein each test structure 250 may be processed with a different focus setting in order to determine an appropriate focus parameter range while taking into consideration the expected maximum range of structural variation represented by each of the individual test structures 250. Consequently, appropriate focus parameters may be identified prior to actually processing product substrates, thereby efficiently contributing to a reduced cycle time in combination with a reduced yield loss, since respective electrical tests may be avoided or at least substantially reduced, which may otherwise have to be performed to evaluate the corresponding focus parameter settings previously used in forming the corresponding structure. In other illustrative embodiments, the test structures 250 may be incorporated into product substrates wherein corresponding focus-related measurement data may be obtained along with standard CD measurement data, thereby providing the potential to efficiently control focus parameter values for product substrates to be processed at a later stage.

Figure 2D:
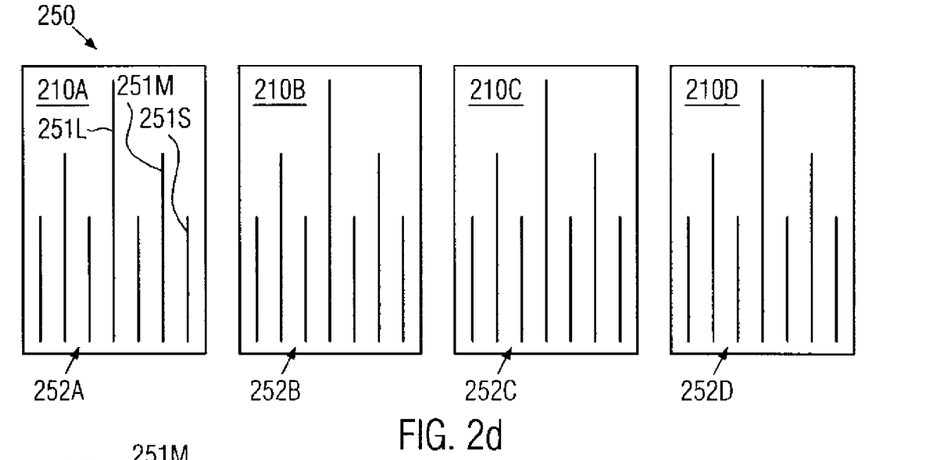
FIGS. 2d-2e schematically illustrate a top view and a cross-sectional view, respectively, of a further test structure usable for obtaining CD measurement data, wherein the plurality of test sites may be formed above respective device areas including a different metal density formed by a well-defined process flow according to further illustrative embodiments.

FIG. 2d schematically illustrates the test structure 250 according to a further illustrative embodiment, wherein respective test sites 252A, 252B, 252C, 252D may comprise respective test features 251S, 251M, 251L as may also be advantageously used for efficient CD measurements, i.e., the corresponding features 251S, 251M, 251L may have substantially the same lateral design dimension, i.e., in FIG. 2d the horizontal dimension, while a length of the corresponding features may vary in order to "simulate" different packing densities in a single test site. For instance, the features 251S may represent a high packing density, the features 251M, that is, the portion thereof extending beyond the features 251S may represent a medium packing density, and similarly the feature 251L may represent a substantially isolated line. Furthermore, the corresponding test sites 252A, 252B, 252C, 252D may each be formed above the respective area 210A, 210B, 210C, 210D, representing a different state of a structural characteristic. In one illustrative embodiment, the areas 210A, 210B, 210C, 210D may contain a different amount or density of metal provided within a respective dielectric material. For example, the different amount of metal may be generated by providing metal-containing regions with different size and/or density in the respective areas 210A, 210B, 210C, 210D in order to provide the desired structural differences. The provision of a different amount or density of metal may efficiently "encode" CMP-induced non-planarities into the test structure 250, as is previously explained.

Figure 2E:
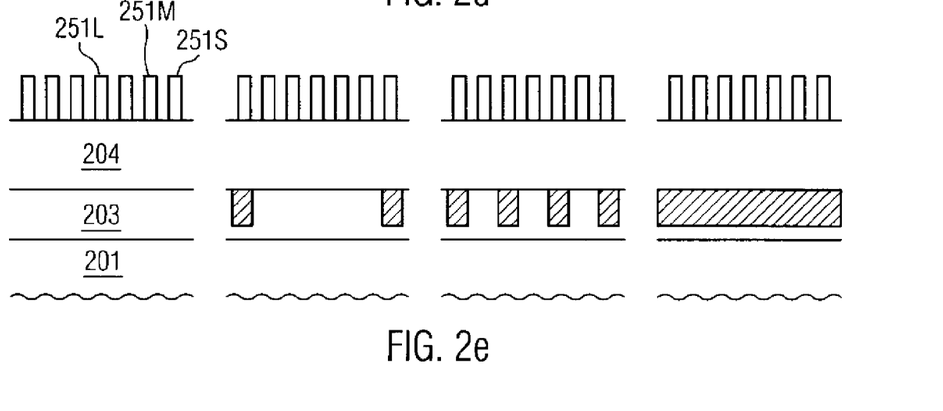

FIG. 2e schematically illustrates respective cross-sectional views of the respective test sites 252A, 252B, 252C, 252d and the corresponding areas 210A, 210B, 210C, 210D according to one illustrative embodiment. Here, the features 251S, 251M, 251L, collectively referred to as features 251, may represent respective resist features formed on the basis of a lithography process under specified focus conditions. For example, the respective resist features 251 may be formed above a respective dielectric material 204, which may represent the dielectric layer of a further metallization level of a sophisticated semiconductor device or any other material layer corresponding to the device level under consideration. Moreover, the respective material layer 203 may have incorporated therein a varying degree of metal material, which, in the embodiment shown, may vary between substantially 0% to approximately 100% for the area 210D. It should be appreciated that the corresponding percentages may describe the corresponding amount of metal material within a specific sub-layer of the material layer 203 within lateral boundaries, which are substantially defined by the lateral extension of the respective test sites 252A, 252B, 252C, 252D. That is, the corresponding metal amount related to a respective one of the areas 210A, 210B, 210C, 210D is to be considered as the total amount of metal contained in the layer 203 within this area. Hence, in the area 210A, the features 251 may be formed above a substantially metal-free region, whereas, in the area 210D, a substantially continuous metal region may be provided below the respective features 251. Similarly, the areas 210B, 210C may have any intermediate values in order to provide any intermediate values for the structural characteristic under consideration. It should be appreciated that the test sites 210A, 210B, 210C, 210D may not necessarily have included therein the respective varying characteristics with respect to planarity in the order as shown, but these characteristics may be incorporated in any appropriate manner, as desired. Moreover, as shown, the respective varying degree of metal density may be obtained on the basis of respective metal regions, such as metal lines, wherein, however, any other appropriate size and shape may be used. In some illustrative embodiments, the corresponding varying metal densities may be established on the basis of device features as are also typically encountered in product areas of the device layer under consideration. In some illustrative embodiments, the same metal density may be established by using differently sized features, if a corresponding dependence on the planarity is expected. For example, the area 210B may have a specified degree of non-planarity with respect to the other areas, which may be caused by the presence of two metal trenches representing substantially isolated metal lines. In other cases, the corresponding respective metal density may be obtained by providing a plurality of metal trenches with reduced spacing and also with reduced lateral dimensions in order to obtain substantially the same amount of metal. Since typically the respective metal-containing structures may be formed according to the same etch process sequence, a respective distinct metal density at a surface portion of the material layer 203 may also imply a well-defined distinct amount of metal within the corresponding metal layer 203, since substantially identical depth for the respective structures may be obtained. It should be appreciated, however, that in other strategies when features of different depths may be contemplated, an identical metal density at the surface of the material layer 203 for different areas 210A, 210B, 210C, 210D may not necessarily result in the same amount of metal incorporated into the material layer 203. Thus, if respective differences of size and shape of respective metal-containing features may be considered as being appropriate for also influencing the degree of non-planarity during a corresponding manufacturing sequence, respective test sites may be formed on the basis of such differences in order to more accurately determine the influence on the focus parameter settings.

The test structure 250 as shown in FIGS. 2d and 2e may be formed on the basis of well-established techniques, as are also described with reference to the semiconductor device 100, wherein, for instance, appropriate inlaid or damascene strategies may be used in order to form the material layer 203 having incorporated therein the varying metal density, wherein the corresponding differences in metal density may result in CMP-induced non-planarities, which may therefore also be present in the respective test sites 252A, 252B, 252C, 252D. Hence, respective CD measurement results obtained from the individual test sites may be efficiently used for evaluating the focus setting under consideration.

Figure 3:
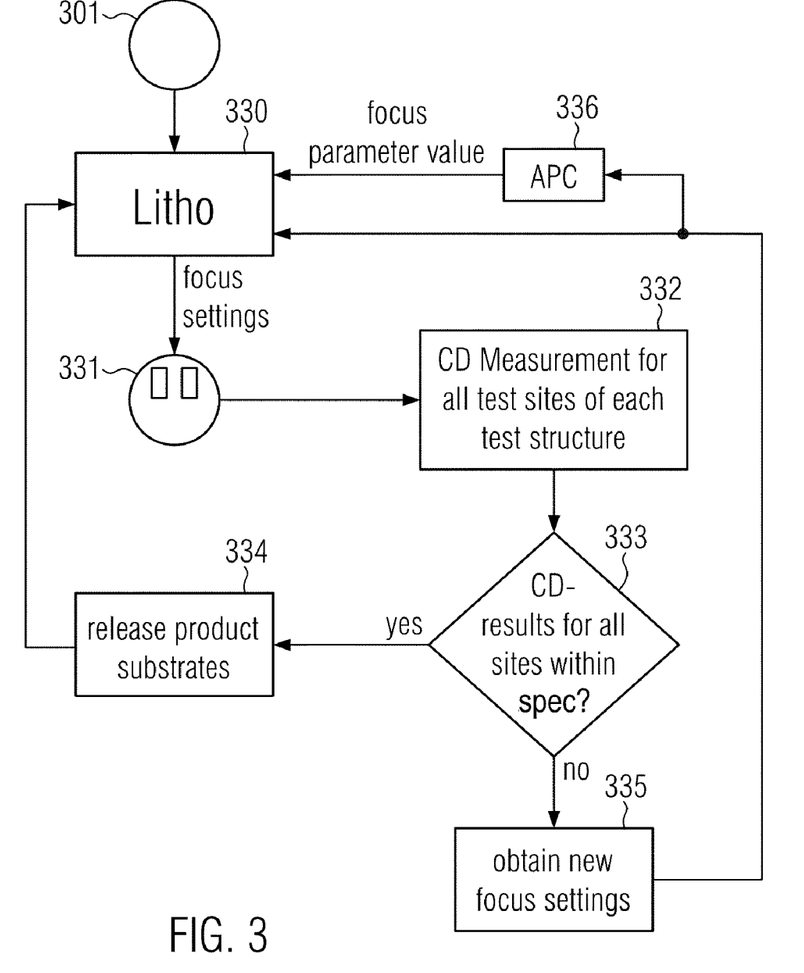
FIG. 3 schematically illustrates a process flow for estimating focus-related process parameters on the basis of CD measurement results and using the corresponding evaluation results for releasing product substrates and/or for controlling the corresponding focusing procedure according to yet other illustrative embodiments disclosed herein.

FIG. 3 schematically illustrates a process flow for evaluating and/or controlling focus settings used during a lithography process according to illustrative embodiments disclosed herein. In FIG. 3, a lithography module 330 may comprise a lithography tool and any related process tools for creating respective resist features, wherein the lithography module 330 may be operated on the basis of an appropriate focusing procedure as previously described. The lithography module 330 may receive respective substrates 301 which may represent dedicated test substrates or product substrates above which are to be formed the focus sensitive CD measurement test structures as previously described with reference to FIGS. 2a-2e. Thus, the substrate 301 may be processed in the module 330 thereby generating a plurality of processed exposure fields 331, wherein each of the exposure fields 331 may be exposed on the basis of a corresponding focus finding procedure resulting in respective values of focus parameters, such as tilt angles in two different directions and the like. At least one of the exposure fields 331 may comprise one of the focus sensitive test structures as previously described. After processing the substrates 301, one or more of these substrates may be subjected to a CD measurement process, indicated as 332, wherein each test site of the corresponding focus sensitive test structure is inspected in order to generate a respective measurement data set for each of the respective test sites. In a next step 333, the respective measurement data may be used for evaluating the corresponding focus settings used in the previous lithography process. For instance, in some illustrative embodiments, the CD measurement results for each of the test sites may be compared to respective threshold value ranges in order to determine whether or not the corresponding CD measurement results are within an allowable range. Since the plurality of measurement test sites may represent a significant portion of the range of non-planarities to be expected on actual product areas, at least within a specific one of the exposure fields 331, the corresponding set of focus values may be evaluated as being appropriate, at least for a location corresponding to the specified exposure field, when all test sites produce critical dimensions within the specifications. In this case, in step 334, the validity of the focus parameters used for the exposure field 331 may be indicated to the lithography module 330. If one or more of the test sites indicate a significant deviation of the corresponding critical dimensions, the corresponding focus parameter setting may be indicated as an inappropriate parameter setting and new focus settings may be established in step 335. In some illustrative embodiments, the step 335 may be operatively connected to an appropriate APC (advanced process control) module 336 used for controlling the focus procedure within the lithography module 330. In this case, the corresponding measurement results obtained in step 332 may be used, with or without a preceding evaluation, as respective feedback data for the focus controller 336, which may then supply updated focus parameter values to be used for further substrates to be processed in the module 330.

Since the respective measurement data 332 may be obtained on the basis of well-established CD measurement strategies, a corresponding delay with respect to information on the focus parameter settings may be within usual process times as are encountered for actual CD measurements and hence corresponding focus-related electrical data may not be required, or the amount thereof may at least be significantly reduced. Furthermore, due to the availability of respective focus-related measurement data, an efficient APC strategy may be used for controlling the focus procedure in addition to controlling the exposure dose and time during the lithography process. Moreover, since the respective CD sensitive measurement data may even be obtained on the basis of resist features, inappropriate focus parameter settings may be detected prior to actually forming respective device features, even on product substrates, thereby enabling an enhanced degree of control and providing the potential for reducing yield loss, since, upon detection of inappropriate focus parameter settings, the corresponding product substrates may be reworked on the basis of an updated focus setting.

As a result, the subject matter disclosed herein provides a technique for determining the validity of focus parameter settings by focus sensitive CD measurements in that an appropriately designed CD measurement structure may be provided which includes a plurality of test sites, each of which may represent different focus conditions during the actual exposure process. The different degree of influence on the exposure behavior may be realized by structural components, such as the metal density provided below a respective measurement site, so that respective process related non-uniformities, such as a different degree of planarity and the like, which may for instance be caused by one or more specific manufacturing processes, such as CMP and the like, may be efficiently encoded into the CD test structure. Consequently, well-established measurement techniques may be used for evaluating respective focus settings wherein, in some illustrative embodiments, the corresponding focus sensitive CD measurement data may even be used for controlling the corresponding focusing procedure.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for estimating a parameter setting of a lithography process for forming microstructure features, the method comprising:
obtaining a first measurement data from a first test site representing a specific feature type formed by said lithography process based on a specified focus setting, said first test site being formed above a first area;
obtaining a second measurement data from a second test site representing said specific feature type, said second test site being formed by said lithography process based on said specified focus setting, said second test site being formed above a second area, said first and second areas differing in at least one characteristic affecting focus conditions during said lithography process, wherein said at least one characteristic represents an averaged material composition in said first and second areas below said first and second test sites, respectively; and
estimating said specified focus setting on the basis of said first and second measurement data.

2. The method of claim 1, wherein said averaged material composition in said first and second areas is determined by a respective pattern density of device features formed in at least one material layer provided in said first and second areas below said first and second test sites, respectively.

3. The method of claim 1, further comprising controlling, on the basis of said first and second measurement data, a focus adjustment process during a lithography process for forming features of said specific type above one or more product substrates.

4. The method of claim 1, wherein said specific feature type represents metal regions of a metallization structure of a semiconductor device.

5. The method of claim 1, further comprising obtaining at least one further measurement data from at least one further test site representing said specific feature type, said further test site being formed above at least one further area during said lithography process based on said specified focus setting, said at least one further test site differing from said first and second test sites in at least one characteristic affecting focus conditions during said lithography process.

6. The method of claim 1, wherein estimating said specified focus setting comprises evaluating a critical dimension of said specific feature type on the basis of said first and second measurement data.

7. The method of claim 6, further comprising establishing a new focus setting when critical dimensions of said first and second test sites are outside a specified value range.

8. A method, comprising:
evaluating at least one lateral dimension of a first test feature of a semiconductor device, said first test feature being formed on the basis of a specified design above a first area by using a lithography process, said first area comprising a first density of metal below said first test feature;
evaluating at least one lateral dimension of a second test feature of a semiconductor device, said second test feature being formed on the basis of said specified design above a second area by using said lithography process, said second area comprising a second density of metal below said second test feature that differs from said first density of metal below said first test feature; and
determining the validity of at least one parameter used for adjusting a focus during said lithography process on the basis of said at least one evaluated lateral dimension of said first and second test features.

9. The method of claim 8, wherein said first and second areas are formed by using a chemical mechanical polishing process for planarizing a surface topography prior to forming said first and second features.

10. The method of claim 8, further comprising evaluating at least one lateral dimension of at least one further test feature of a semiconductor device, said at least one further test feature being formed on the basis of said specified design above at least one further area by using said lithography process, said at least one further area comprising at least one further density of metal that differs from said first and second densities, wherein the validity of said at least one process parameter is determined on the basis of the evaluated at least one lateral dimension of said at least one further test feature.

11. The method of claim 8, wherein said at least one lateral dimension represents a critical dimension of a device feature of a metallization layer of a semiconductor device.

12. The method of claim 8, wherein determining the validity of said at least one process parameter comprises assessing said at least one process parameter as having a valid value when said evaluated first and second lateral dimensions are within a predefined range.

13. The method of claim 12, further comprising forming features corresponding to said first and second test features on a plurality of product substrates when the validity of said at least one process parameter is positively determined.

14. A method for estimating a parameter setting of a lithography process for forming microstructure features, said method comprising:
obtaining a first measurement data from a first test site formed above a first device area having a first pattern density of device features formed in at least one material layer thereof below said first test site, said first test site representing a specific feature type formed by said lithography process based on a specified focus setting;
obtaining a second measurement data from a second test site formed above a second device area having a second pattern density of device features formed in at least one material layer thereof below said second test site, said second test site representing said specific feature type formed by said lithography process based on said specified focus setting, and said second pattern density being different from said first pattern density;
estimating said specified focus setting by evaluating a critical dimension of said specific feature type in each of said first and second test sites on the basis of said first and second measurement data; and
establishing a new focus setting when said critical dimension of said specific feature type in said first and second test sites are outside a specified value range.

15. The method of claim 14, wherein said specific feature type represents metal regions of a metallization structure of a semiconductor device.

16. The method of claim 14, further comprising obtaining a third measurement data from a third test site formed above a third device area having a third pattern density of device features formed in at least one material layer thereof, said third test site representing said specific feature type formed by said lithography process based on said specified focus setting, and said third pattern density being different from said first and second pattern densities.

* * * * *